(12) United States Patent
Tomita et al.

(10) Patent No.: US 10,111,368 B2
(45) Date of Patent: Oct. 23, 2018

(54) FLEXIBLE SUBSTRATE RETENTION ON A REUSABLE CARRIER

(71) Applicant: Intel Corporation, Santa Clara, CA (US)

(72) Inventors: Yoshihiro Tomita, Tsukuba (JP); Joshua D. Heppner, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 219 days.

(21) Appl. No.: 14/973,510

(22) Filed: Dec. 17, 2015

(65) Prior Publication Data

US 2017/0181338 A1 Jun. 22, 2017

(51) Int. Cl.
*H01L 51/00* (2006.01)
*H05K 13/00* (2006.01)
*H01L 23/40* (2006.01)
*H05K 3/32* (2006.01)
*B23P 19/04* (2006.01)
(Continued)

(52) U.S. Cl.
CPC .......... *H05K 13/0069* (2013.01); *B23P 19/04* (2013.01); *H01L 23/40* (2013.01); *H01L 23/544* (2013.01); *H05K 1/0393* (2013.01); *H05K 3/326* (2013.01); *H05K 13/0023* (2013.01); *H01L 23/4985* (2013.01); *H01L 51/003* (2013.01); *H01L 51/0097* (2013.01); *H01L 2223/54426* (2013.01); *H01L 2223/54486* (2013.01);
(Continued)

(58) Field of Classification Search
CPC ........... H05K 13/0023; H05K 13/0069; H05K 1/0393; H05K 2201/05; H05K 3/326; H01L 23/40; H01L 51/003; H01L 51/0097; H01L 23/4985; H01L 23/544; H01L 2223/54426; H01L 2223/54486; B23P 19/04; Y10T 29/49126; Y10T 29/53265
See application file for complete search history.

(56) References Cited

U.S. PATENT DOCUMENTS 5,172,472 A * 12/1992 Lindner ............... H05K 3/326
174/266
2002/0093080 A1 7/2002 Kay
(Continued)

FOREIGN PATENT DOCUMENTS

JP H10276000 A 10/1998
JP 2008078522 A * 4/2008

OTHER PUBLICATIONS

International Search Report and Written Opinion dated Feb. 27, 2017 for International Application No. PCT/US2016/061512, 14 pages.

*Primary Examiner* — A. Dexter Tugbang
(74) *Attorney, Agent, or Firm* — Schwabe, Williamson & Wyatt, P.C.

(57) ABSTRACT

Systems to manufacture an electronic circuit assembly are disclosed. In one embodiment, the system includes a flexible substrate with a substrate registration feature and a carrier with a carrier registration feature. A removable fastener removably fixes the flexible substrate to the carrier by being received into the substrate registration feature and the carrier registration feature. Once the flexible substrate is removably affixed to the carrier, the carrier provides the flexible substrate with rigidity to receive at least one electronic device of the electronic circuit assembly.

5 Claims, 5 Drawing Sheets (51) Int. Cl.
   *H05K 1/03*     (2006.01)
   *H01L 23/544*   (2006.01)
   *H01L 23/498*   (2006.01)

(52) U.S. Cl.
   CPC ..... *H05K 2201/05* (2013.01); *Y10T 29/49126* (2015.01); *Y10T 29/53265* (2015.01)

(56) References Cited

U.S. PATENT DOCUMENTS

| | | |
|---|---|---|
| 2004/0027811 A1 | 2/2004 | Onitsuka et al. |
| 2009/0199401 A1 | 8/2009 | Kerr et al. |
| 2009/0300898 A1 | 12/2009 | Wu et al. |
| 2012/0161197 A1* | 6/2012 | Im .................... H01L 51/0097 257/100 |
| 2014/0290052 A1* | 10/2014 | Bujade .............. Y10T 29/49126 29/830 |

* cited by examiner

FLEXIBLE SUBSTRATE RETENTION ON A REUSABLE CARRIER

TECHNICAL FIELD

Embodiments of the present disclosure generally relate systems and methods for retention of a flexible substrate on a reusable carrier to manufacture electronic assemblies.

BACKGROUND

Wearable technology is a category of electronic assemblies that are worn by a consumer. Wearable technology often tracks information related to a consumer's health or fitness. Most wearable technology is worn on a consumer's wrist, but an increasing number may be clipped to the body, worn around a finger, hung around the neck, or sewn into various garments worn by consumers. Wearable technology is becoming widespread as the Internet of Things expands its reach.

Wearable technology often includes electronic assemblies built on flexible substrates. The flexible substrates may be temporarily restrained or fixed to a carrier to ensure that the substrates remain relatively rigid during the processes that place and permanently attach electronic components to manufacture the electronic assemblies. At the end of these processes, however, the flexible substrates with the permanently attached electronic components may be removed from the carrier for further processing or packaging. The flexible substrates may be temporarily fixed to a carrier using double stick tape but the tape may be used a limited number of times before requiring manual cumbersome and costly replacement.

BRIEF DRAWINGS DESCRIPTION

The present disclosure describes various embodiments that may be understood and fully appreciated in conjunction with the following drawings.

DETAILED DESCRIPTION

Embodiments of the present disclosure include a system to manufacture an electronic circuit assembly. In one embodiment, the system includes a flexible substrate with a substrate registration feature and a carrier with a carrier registration feature. A removable fastener removably fixes the flexible substrate to the carrier by being received into the substrate registration feature and the carrier registration feature. Once the flexible substrate is removably affixed to the carrier, the carrier provides the flexible substrate with rigidity to receive at least one electronic device of the electronic circuit assembly. Other embodiments may be described and/or claimed.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other.

Figure 1A:
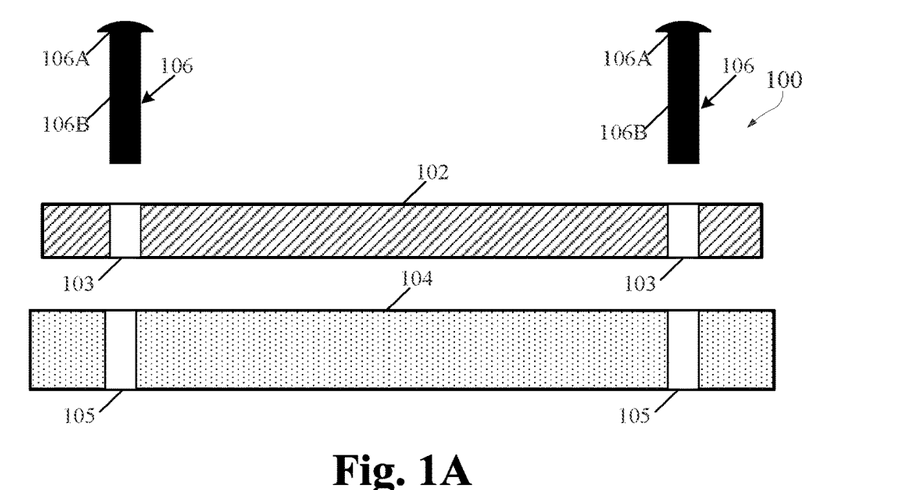
FIGS. 1A and 1B schematically illustrate a cross-section side-view of an example system for retaining a flexible substrate to a reusable carrier, in accordance with some embodiments.
Figure 1B:
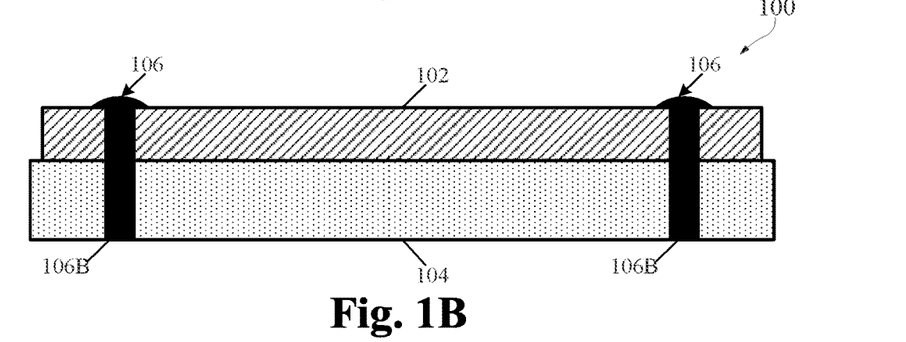
Figure 1C:
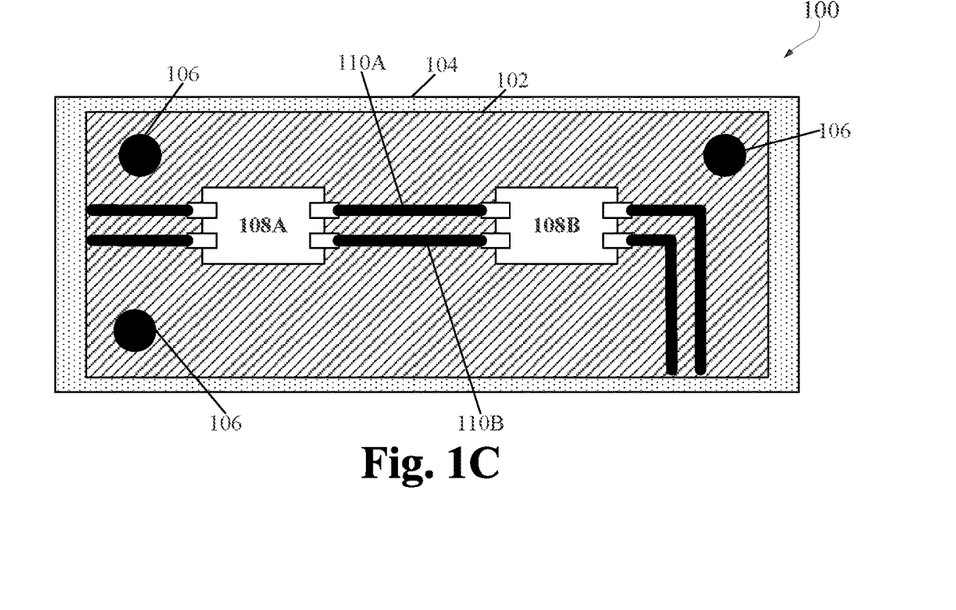
FIG. 1C schematically illustrates a top-view of an example system for retaining a flexible substrate to a reusable carrier, in accordance with some embodiments.

FIGS. 1A and 1B schematically illustrate a cross-section side-view of an example system 100 for retaining a flexible substrate 102 to a carrier 104 using a fastener 106, in accordance with some embodiments. FIG. 1C schematically illustrates a top-view of an example system 100, in accordance with some embodiments. Referring to FIGS. 1A, 1B, and 1C, flexible substrate 102 may be a bendable, pliable, supple, stretchable, or otherwise flexible substrate upon which electronic components 108A and 108B are mounted to form electronic assemblies. Flexible substrate 102 may be made of any kind of flexible materials known to a person of ordinary skill in the art including flexible fabrics and plastic or polymer substrates, e.g., polyimide (PI), polyester (PET), polyethylene napthalate (PEN), polyetherimide (PEI), fluropolymers (FEP), copolymers, polyether ether ketone (PEEK), and the like. Flexible substrate 102 may have any size or shape appropriate for the electronic assemblies that will be built upon it. Flexible substrate 102 may be thin, e.g., 12-125 μm, but thinner and thicker substrates are possible.

The electronic assemblies built on flexible substrate 102 may be of any kind known to a person of ordinary skill in the art including many of the electronic assemblies used in common electronic consumer devices, e.g., cameras, phones, laptops, and the like. The electronic assemblies built on flexible substrate 102 may include wearable technology, wearables, fashion technology, tech togs, or fashion electronics including watches and other jewelry as well as clothing garments with embedded technology. Wearable technology may have a variety of functions including fitness tracking, synchronizing data to other computing devices, monitoring health, navigating, communicating, and the like.

Flexible substrate 102 may be used in tightly assembled electronic devices where electrical connections are required in tight spaces, e.g., cameras, mobile devices, and smaller personal computing devices.

Flexible substrate 102 may include conductive traces, e.g., traces 110A and 110B, to electronically couple components, e.g., components 108A and 108B. For example, component 108A may be electronically coupled to component 108B through traces 110A and 110B. Electronic components 108A and 108B may be surface mount or through hole components as is well known to a person of ordinary skill in the art. Flexible substrate 102 may include one or more electronic components, e.g., 108A and 108B, or flexible substrate 102 may include no electronic components at all as is well known to a person of ordinary skill in the art.

Flexible substrate 102 may include at least one substrate registration feature 103. Substrate registration feature 103 may include a hole drilled or otherwise cut out of substrate 102. Substrate registration feature 103 may be cut by hand by an operator, e.g., using a knife or blade. Substrate registration feature 103 may alternatively be cut automatically by sophisticated machines. In an embodiment, substrate registration feature 103 may be cut out of substrate 102 to precise depth, size, and shape requirements using laser-based or other machines. Flexible substrate 102 may include one or more substrate registration features 103 based on size, number of electronic components, manufacturing processes, and the like. Substrate registration feature 103 may have any size or shape appropriate for its intended application. In an embodiment, substrate registration feature 103 may be circular to receive fastener 106 having a cylindrical body 106B with a circular cross-section.

Electronic components 108A and 108B may be permanently mounted to flat solder pads (not shown) on flexible substrate 102 using e.g., solder, as is well known to a person of ordinary skill in the art. In an embodiment, components 108A and 108B may be automatically placed on the solder pads of flexible substrate 102, which is then conveyed into a reflow soldering oven that melts the solder to permanently mount the electronic components 108A and 108B to flexible substrate 102.

Carrier 104 may provide substrate 102 with rigidity for downstream manufacturing processes including the permanent mounting of electronic components 108A or 108B using any known manufacturing process, e.g., reflow soldering. Carrier 104 may be made of any material appropriate for its intended application including plastics, polymers, and metals. In an embodiment, carrier 104 may be made of a material capable of withstanding high temperatures that are often part of reflow soldering manufacturing processes.

Carrier 104 may include at least one carrier registration feature 105. Carrier registration feature 105 may include a hole drilled, molded, or otherwise cut out of carrier 104. Carrier registration feature 105 may be cut by hand by an operator, e.g., using a knife or blade. Carrier registration feature 103 may alternatively be cut automatically by sophisticated machines. In an embodiment, carrier registration feature 105 may be cut out of carrier 104 to precise depth, size, and shape requirements using laser-based, drilling, or other machines. Carrier 104 may include one or more carrier registration features 105 based on size of carrier 104 or substrate 102, number of electronic components, manufacturing processes, and the like.

Carrier registration feature 105 may have any size or shape appropriate for its intended application. In an embodiment, carrier registration feature 105 may be circular to receive fastener 106 having a cylindrical body 106B with a circular cross-section. In an embodiment where carrier 104 may be made of plastic, carrier registration feature 105 may be molded or drilled into carrier 104.

Fastener 106 may removably fixed substrate 102 to carrier 104 when received by substrate registration feature 103 and carrier registration feature 105. Fastener 106 may comprise a head 106A and a body 106B in e.g., a rivet, screw, nail, or the like, or only a body 106B in e.g., a peg or post. Substrate registration feature 103 and carrier registration feature 105 may receive at least a portion of body 106B. In such an embodiment, head 106A may facilitate insertion and removal to removably fix (and detach) substrate 102 from carrier 104.

To removably fix substrate 102 to carrier 104, substrate registration feature 103 may be aligned with carrier registration feature 105 and fastener 106 may be inserted through both substrate registration feature 103 and carrier registration feature 105. To detach substrate 102 from carrier 104, fastener 106 may be removed from substrate registration feature 103 and carrier registration feature 105 using head 106A or a portion of body 106B. The use of removable fastener 106 may allow reuse of carrier 104 for processing another substrate 102 in a subsequent manufacture of an electronic assembly.

Figure 2A:
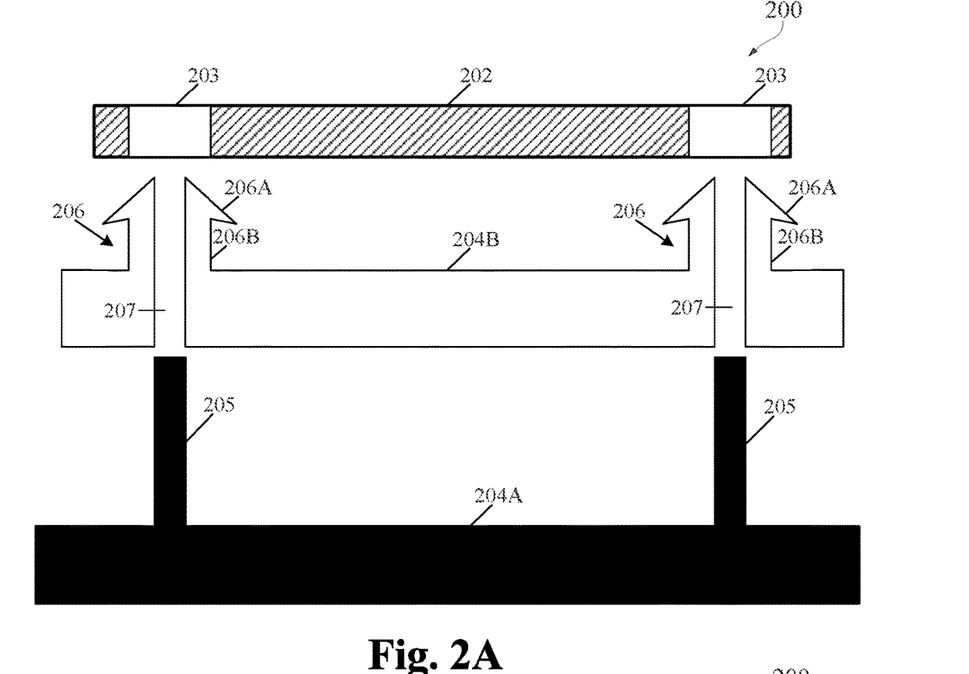
FIGS. 2A, 2B, and 2C schematically illustrate a cross-section side-view of an example system for retaining a flexible substrate to a reusable primary carrier and a reusable secondary carrier, in accordance with some embodiments.
Figure 2B:
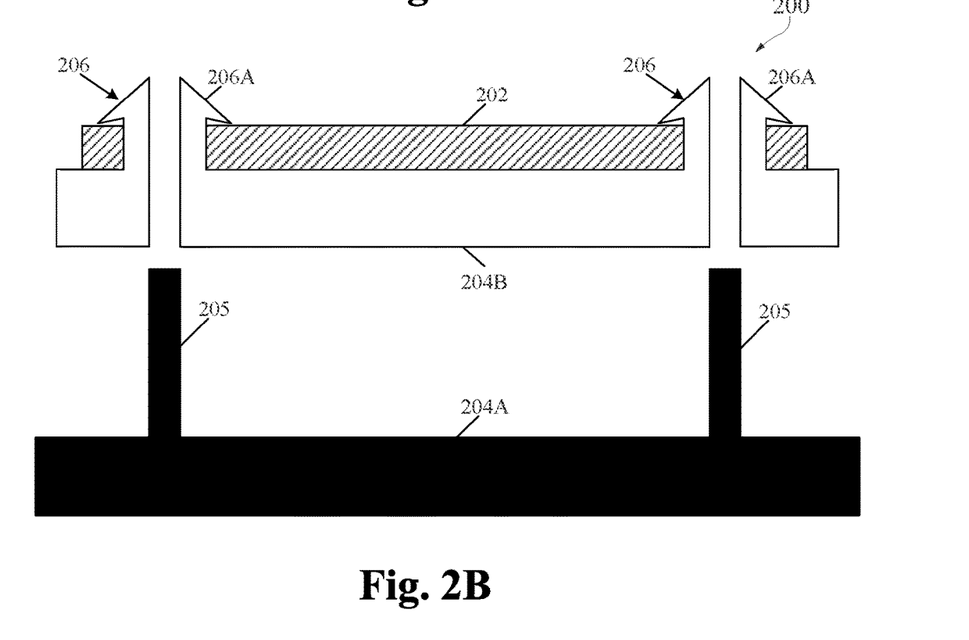
Figure 2C:
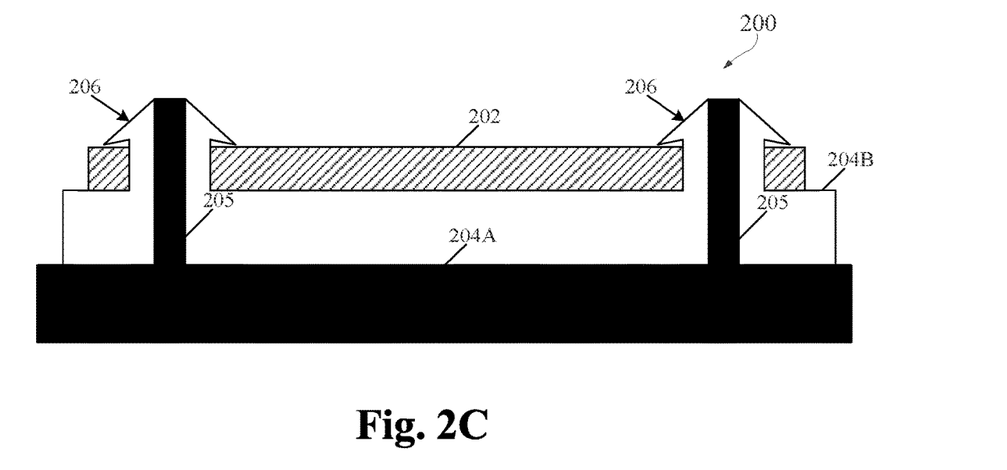
Figure 2D:
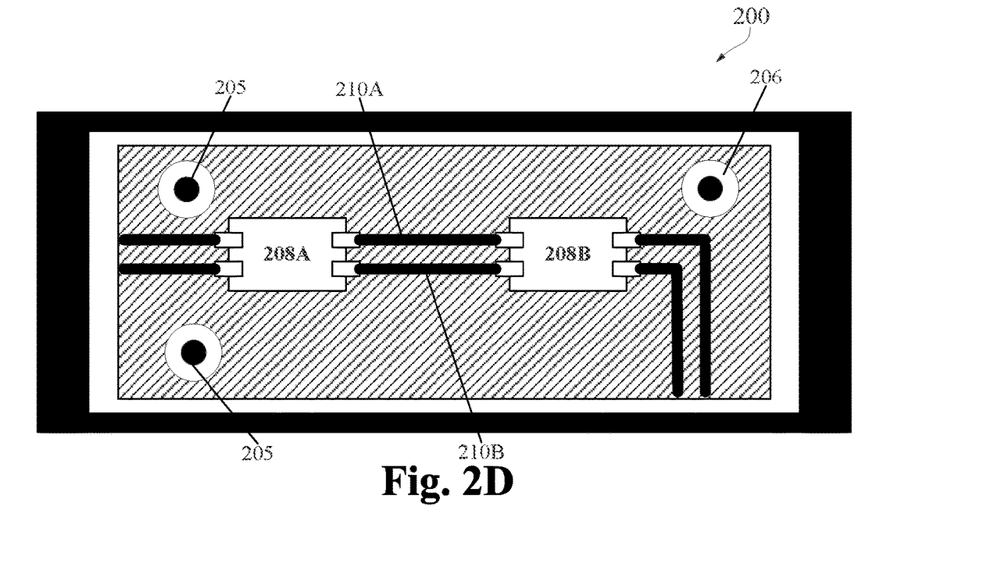
FIG. 2D schematically illustrates a top-view of an example system for retaining a flexible substrate to a reusable primary carrier and a reusable secondary carrier, in accordance with some embodiments.

FIGS. 2A, 2B, and 2C schematically illustrate a cross-section side-view of an example system 200 for retaining a flexible substrate 202 to a reusable primary carrier 204A and a reusable secondary carrier 204B, in accordance with some embodiments. FIG. 2D schematically illustrates a top-view of an example system 200 for retaining a flexible substrate 202 to a reusable primary carrier 204A and a reusable secondary carrier 204B, in accordance with some embodiments. Referring to FIGS. 2A, 2B, 2C, and 2D, system 200 may comprise flexible substrate 202, reusable primary carrier 204A, and reusable secondary carrier 204B. Flexible substrate 202, like flexible substrate 102, may be a bendable, pliable, supple, stretchable, or otherwise flexible substrate upon which electronic components are permanently mounted to form electronic assemblies. Flexible substrate 202 may be made of any kind of flexible materials known to a person of ordinary skill in the art including flexible fabrics and plastic or polymer substrates, e.g., polyimide (PI), polyester (PET), polyethylene napthalate (PEN), polyetherimide (PEI), fluropolymers (FEP), copolymers, polyether ether ketone (PEEK), and the like. Flexible substrate 202 may have any size or shape appropriate for the electronic assemblies that will be built upon it. Flexible substrate 202, like flexible substrate 102, may be thin, e.g., 12-125 µm, but thinner and thicker substrates are possible.

The electronic assemblies built on flexible substrate 202 may similar to those built on flexible substrate 102 described above including many of the electronic assemblies used in common electronic consumer devices, e.g., cameras, phones, laptops, and the like, as is well known to a person of ordinary skill in the art.

Flexible substrate 202 may include conductive traces, e.g., traces 210A and 210B, to electronically couple components, e.g., components 208A and 208B. For example, component 208A may be electronically coupled to component 208B through traces 210A and 210B. Electronic components 208A and 208B may be surface mount or through hole components as is well known to a person of ordinary skill in the art.

Flexible substrate 202 may include at least one substrate registration feature 203. Substrate registration feature 203 may include a hole drilled or otherwise cut out of substrate 202. Substrate registration feature 203 may be cut by hand by an operator, e.g., using a knife or blade. Substrate registration feature 203 may alternatively be cut automatically by sophisticated machines. In an embodiment, substrate registration feature 203 may be cut out of substrate 202 to precise depth, size, and shape requirements using laser-based or other machines. Flexible substrate 202 may include one or many substrate registration features 203 depending on size and other characteristics. Substrate registration feature 203 may have any size or shape appropriate for its intended application. In an embodiment, substrate registration feature 203 may be circular to receive a fastener 206 with a circular cross-section.

Electronic components 208A and 208B may be permanently mounted to flat metal pads (not shown) on flexible substrate 202 using e.g., solder, as is well known to a person of ordinary skill in the art. In an embodiment, components 208A and 208B may be automatically placed on the solder pads of flexible substrate 202, which is then conveyed into a reflow soldering oven that melts the solder to permanently mount the electronic components 208A and 208B to flexible substrate 202 as is well known.

Primary carrier 204A and secondary carrier 204B may provide substrate 202 with rigidity for downstream manufacturing processes including the permanent mounting of electronic components 208A or 208B using any known manufacturing process, e.g., reflow soldering. Primary carrier 204A and secondary carrier 204B may be made of any material appropriate for its intended application including plastics, polymers, and metals. Primary carrier 204A may be a same or different material than secondary carrier 204B. In an embodiment, primary carrier 204A or secondary carrier 204B may be made of a material capable of withstanding high temperatures that are often part of reflow soldering manufacturing processes.

Primary carrier 204A may include a primary carrier registration feature 205 to receive flexible substrate 202. Primary carrier registration feature 205 may have any shape and size known to a person of ordinary skill in the art and appropriate for its intended application including a post or a peg with a circular cross section. In an embodiment, primary carrier registration feature 205 may be built into primary carrier 204A either by molding, cutting, drilling, or otherwise.

Fastener 206 may be built into secondary carrier 204B, e.g., by molding fastener 206 into a plastic secondary carrier 204B or by cutting fastener 206 out of a metal secondary carrier 204B. In an embodiment, fastener 206 may be a separate component that is permanently attached to second carrier 204B by any means to a person of ordinary skill in the art. In an embodiment, fastener 206 may have a split rivet shape having a head 206A and a body 206B.

A secondary registration feature 207 may extend vertically through body 206B to receive primary carrier registration feature 205. Head 206A may receive flexible substrate 202 through insertion into substrate registration feature 203 as shown in FIG. 2B. Head 206A may include flanges to secure flexible substrate 202 against secondary carrier 204B. In an embodiment, head 206A may contract horizontally by e.g., pinching or otherwise bringing together head 206A, to ease insertion of head 206A into substrate registration feature 203.

Once substrate 202 is secured to secondary carrier 204B by inserting head 206A into substrate registration feature 203, a vertical length of secondary carrier registration feature 207 receives primary carrier registration feature 205 to removably fix flexible substrate 202 to primary carrier 204A and secondary carrier 204B. In an embodiment, insertion of primary carrier registration feature 205 into a vertical length of secondary carrier registration feature 207 may expand head 206A or body 206B of fastener 206 substantially horizontally against substrate registration feature 203 of flexible substrate 202 to removably secure flexible substrate to primary carrier 204A and secondary carrier 204B.

To detach substrate 202 from primary carrier 204A and secondary carrier 204B, primary carrier 204A is first removed by sliding primary carrier registration feature 205 from secondary registration feature 207. Thereafter, fastener 206 may be pinched at head 206A or body 206B to release substrate 202. Use of fastener 206 on secondary carrier 204B allows reuse of primary carrier 204A and secondary carrier 204B to manufacture a subsequent electronic assembly on another flexible substrate 202.

Figure 3:
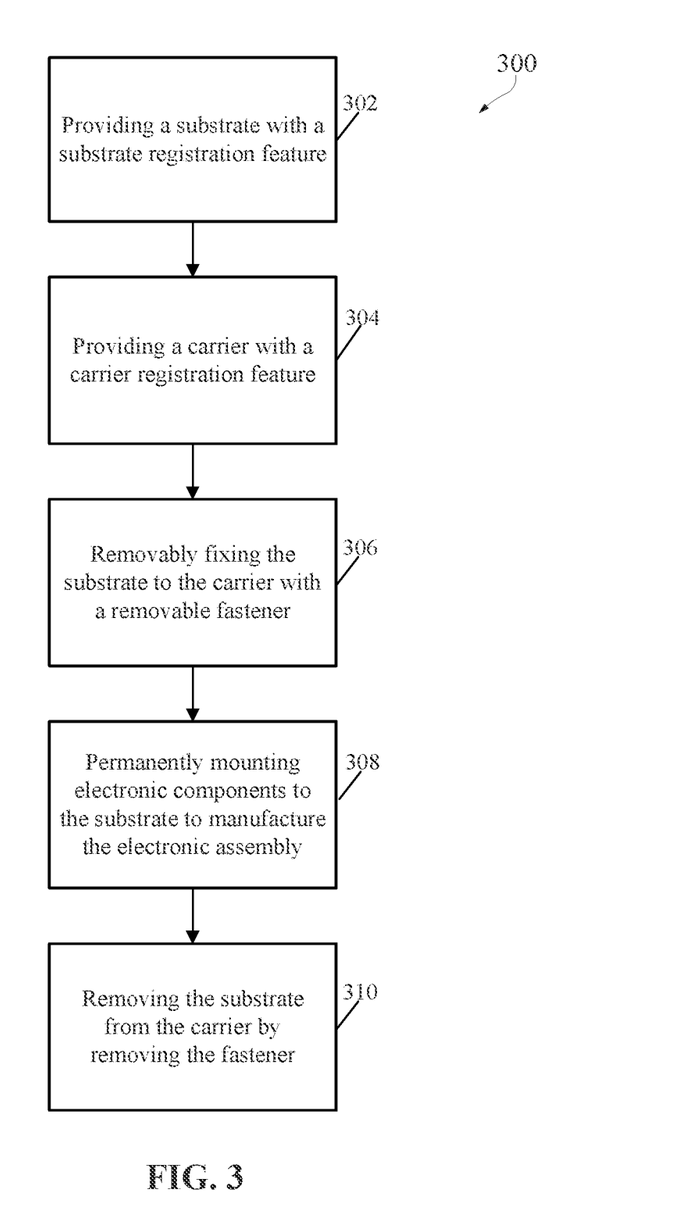
FIG. 3 schematically illustrates an example method to manufacture an electronic assembly involving removably fixing a flexible substrate to a carrier, in accordance with some embodiments.

FIG. 3 schematically illustrates an embodiment of a method 300 to manufacture an electronic assembly involving removably fixing a flexible substrate to a carrier. Referring to FIG. 3, at 302, method 300 may include providing a flexible substrate with a substrate registration feature. At 304, method 300 may further include providing a carrier with a carrier registration feature. At 306, method 300 may further include removably fixing the flexible substrate to the carrier with a removable fastener, e.g., rivet, screw, nail, peg, or post, inserted through and received by the carrier registration feature and the substrate registration feature. At 308, method 300 may further include permanently mounting electronic components to the flexible substrate to manufacture the electronic assembly. At 310, method 300 may further include removing the flexible substrate from the carrier by removing the fastener after mounting the electronic components to the flexible substrate. By so attaching the flexible substrate to the reusable carrier, the flexible substrate may remain flat avoiding warpage during downstream processes including high-temperature reflow.

Figure 4:
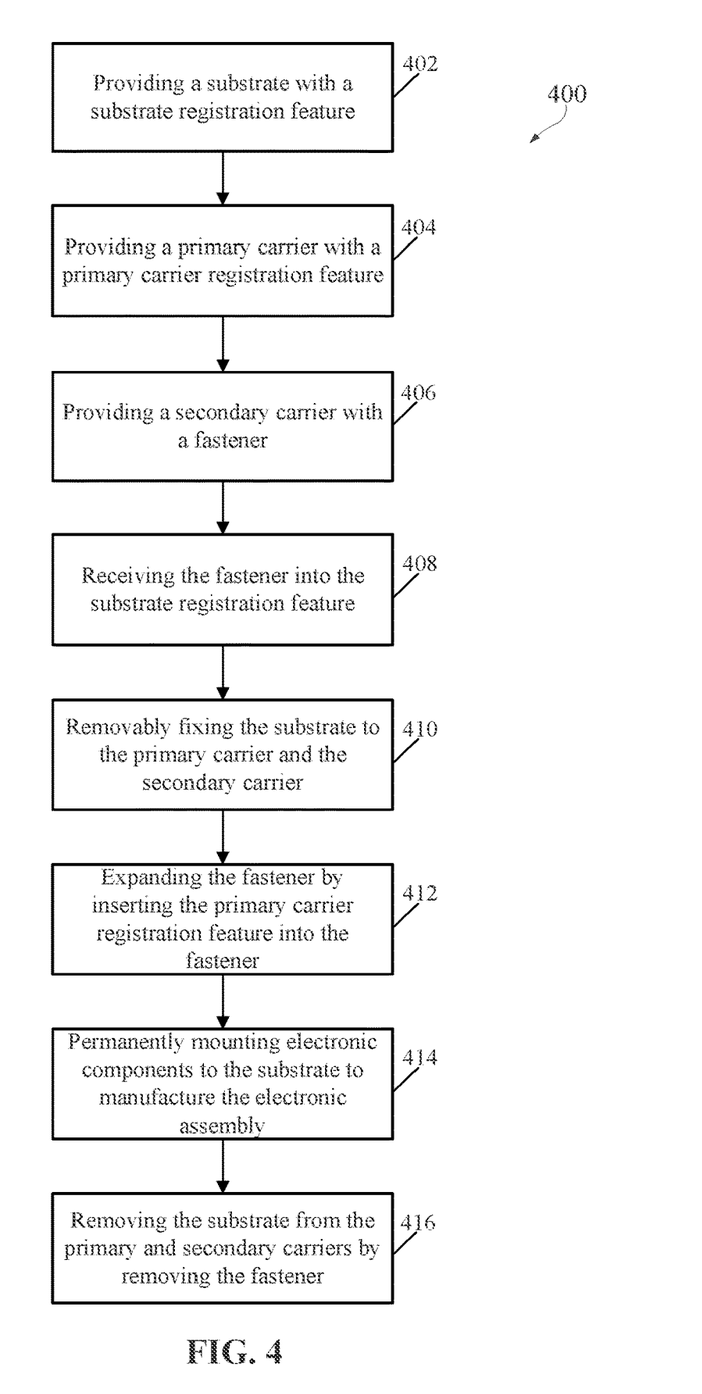
FIG. 4 schematically illustrates an example method to manufacture an electronic assembly involving removably fixing a flexible substrate to a carrier, in accordance with some embodiments.

FIG. 4 schematically illustrates an embodiment of a method 400 to manufacture an electronic assembly. Referring to FIG. 4, at 402, method 400 may include providing a flexible substrate with a substrate registration feature. At 404, method 400 may further include providing a primary carrier with a primary carrier registration feature, e.g., a post or peg, which, in some embodiments, may be built into the primary carrier. At 406, method 400 may further include providing a secondary carrier with a fastener, e.g., a rivet or split rivet, which, in some embodiments, may be built into the secondary carrier. At 408, method 400 may further include receiving a head of the fastener into the substrate registration feature of the flexible substrate by, e.g., pinching or otherwise bringing together ends of the head to allow ease of insertion into substrate registration feature. At 410, method 400 may further include removably fixing the flexible substrate to the primary carrier and the secondary carrier by inserting the primary carrier registration feature into a vertical length of the fastener built into the secondary carrier. At 412, method 400 may further include expanding the head of the fastener substantially horizontally against the substrate registration feature of the substrate by inserting the primary carrier registration feature into a bottom end of the vertical length of the fastener to removably secure the substrate to the primary carrier and the secondary carrier. At 414, method 400 may further include permanently mounting electronic components to the flexible substrate to manufacture the electronic assembly. At 416, method 400 may further include removing the flexible substrate from the primary carrier and the secondary carrier after mounting the electronic components to the flexible substrate by removing or sliding the primary carrier registration feature from the vertical length of the faster and releasing the fastener from the substrate.

EXAMPLES

The present disclosure describes various example embodiments including, but are not limited to:

Example 1 may be a system to manufacture an electronic circuit assembly, comprising a flexible substrate to receive at least one electronic device of the electronic circuit assembly, a primary carrier with a primary carrier registration feature to receive the flexible substrate, and a fastener to be received by the primary carrier registration feature to removably fix the flexible substrate to the primary carrier that will receive the at least one electronic device of the electronic assembly when the flexible substrate is affixed to the primary carrier.

Example 2 may be example 1, wherein the flexible substrate comprises a flexible plastic film.

Example 3 may be example 1, wherein the flexible plastic film comprises a polyimide film, a polyether ether ketone film, or a polyester film.

Example 4 may be example 1, wherein the primary carrier comprises metal or plastic.

Example 5 may be example 1, wherein the primary carrier registration feature comprises at least one hole drilled or molded into the primary carrier.

Example 6 may be example 5, wherein the fastener comprises at least one rivet, screw, peg, or post received in the at least one hole.

Example 7 may be example 2, wherein the fastener comprises a high temperature reflow-compatible material.

Example 8 may be example 2, wherein the flexible substrate comprises a substrate registration feature.

Example 9 may be example 8, wherein the fastener is to be received by the substrate registration feature and the primary carrier registration feature to removably fix the flexible substrate to the primary carrier.

Example 10 may be example 8, wherein the fastener is to be a split rivet built into a secondary carrier, wherein the primary carrier registration feature is to be a post built into the primary carrier, wherein a head of the split rivet is to be received by the substrate registration feature of the flexible substrate, and wherein the post of the primary carrier is to be received by a vertical length of the split rivet built into the secondary carrier to removably fix the flexible substrate to the primary carrier and the secondary carrier.

Example 11 may be example 10, wherein the post of the primary carrier is to be received by the vertical length of the split rivet built into the secondary carrier to expand the head of the split rivet substantially horizontally against the substrate registration feature of the flexible substrate.

Example 12 may be a reusable substrate carrier, comprising a primary carrier with a primary carrier registration feature and a fastener to be received by the primary carrier registration feature to removably fix a flexible substrate to the primary carrier, wherein the flexible substrate is to receive electronic circuit components of an electronic circuit assembly when removably affixed to the primary carrier.

Example 13 may be example 12, wherein the primary carrier registration feature comprises at least one hole drilled or molded into the primary carrier.

Example 14 may be example 12, wherein the fastener comprises one of a rivet, a screw, a peg, or a post.

Example 15 may be example 12, wherein the fastener comprises a high temperature reflow-compatible material.

Example 16 may be example 12, wherein the flexible substrate comprises a substrate registration feature.

Example 17 may be example 16, wherein the fastener is to be received by the substrate registration feature and the primary carrier registration feature when the flexible substrate is removably affixed to the primary carrier.

Example 18 may be example 16, wherein the fastener is to be a split rivet built into a secondary carrier, wherein the primary carrier registration feature is to be a post built into the primary carrier, wherein a head of the split rivet is to be received by the substrate registration feature of the flexible substrate, and wherein the post of the primary carrier is to be received by a vertical length of the split rivet built into the secondary carrier to removably fix the flexible substrate to the primary carrier and the secondary carrier.

Example 19 may be example 18, wherein the post of the primary carrier is to be received by the vertical length of the split rivet built into the secondary carrier to expand the head of the split rivet substantially horizontally against the substrate registration feature of the flexible substrate.

Example 20 may be a method to manufacture an electronic assembly on a flexible substrate, comprising providing a primary carrier with a primary carrier registration feature, removably fixing the flexible substrate to the primary carrier with a fastener received by the primary carrier registration feature, and mounting electronic components to the flexible substrate to manufacture the electronic assembly.

Example 21 may be example 20, further comprising removing the flexible substrate from the primary carrier after mounting the electronic components to the flexible substrate.

Example 22 may be example 20, wherein the flexible substrate comprises a flexible plastic film.

Example 23 may be example 22, wherein the flexible plastic film comprises a polyimide film, a polyether ether ketone film, or a polyester film.

Example 24 may be example 20, wherein the primary carrier comprises metal or plastic.

Example 25 may be example 20, further comprising drilling or molding the primary carrier registration feature into the primary carrier.

Example 26 may be example 25, further comprising removably fixing the flexible substrate to the primary carrier with a rivet, a screw, a peg, or a post received by the primary carrier registration feature.

Example 27 may be example 20, further comprising providing the flexible substrate with a substrate registration feature.

Example 28 may be example 27, further comprising removably fixing the flexible substrate to the primary carrier by receiving the fastener into the substrate registration feature and the primary carrier registration feature.

Example 29 may be example 27, further comprising building a split rivet as the fastener into a secondary carrier, building a post as the primary carrier registration feature into the primary carrier, receiving a head of the split rivet into the substrate registration feature of the flexible substrate, and removably fixing the flexible substrate to the primary carrier and the secondary carrier by inserting the post into a vertical length of the split rivet built into the secondary carrier.

Example 30 may be example 29, further comprising expanding the head of the split rivet substantially horizontally against the substrate registration feature of the substrate by inserting the post into a bottom end of the vertical length of the split rivet.

Example 31 may be a system, comprising means for providing a primary carrier with a primary carrier registration feature, means for removably fixing the flexible substrate to the primary carrier with a fastener received by the primary carrier registration feature, and means for mounting electronic components to the flexible substrate to manufacture an electronic assembly.

Example 32 may be example 31, further comprising means for removing the flexible substrate from the primary carrier after mounting the electronic components to the flexible substrate.

Example 33 may be example 31, wherein the flexible substrate comprises a flexible plastic film.

Example 34 may be example 33, wherein the flexible plastic film comprises a polyimide film, a polyether ether ketone film, or a polyester film.

Example 35 may be example 31, wherein the primary carrier comprises metal or plastic.

Example 36 may be example 31, further comprising means for drilling or molding the primary carrier registration feature into the primary carrier.

Example 37 may be example 36, further comprising means for removably fixing the flexible substrate to the primary carrier with a rivet, a screw, a peg, or a post received by the primary carrier registration feature.

Example 38 may be example 31, further comprising means for providing the flexible substrate with a substrate registration feature.

Example 39 may be example 38, further comprising means for removably fixing the flexible substrate to the primary carrier by receiving the fastener into the substrate registration feature and the primary carrier registration feature.

Example 40 may be example 38, further comprising means for building a split rivet as the fastener into a secondary carrier, means for building a post as the primary carrier registration feature into the primary carrier, means for receiving a head of the split rivet into the substrate registration feature of the flexible substrate, and means for removably fixing the flexible substrate to the primary carrier and the secondary carrier by inserting the post into a vertical length of the split rivet built into the secondary carrier.

Example 41 may be example 39, further comprising means for expanding the head of the split rivet substantially horizontally against the substrate registration feature of the substrate by inserting the post into a bottom end of the vertical length of the split rivet.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments.

Moreover, some embodiments may include apparatuses or systems having any suitable means for carrying out the various operations of the above-described embodiments. The above description of illustrated embodiments, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize. These modifications may be made to embodiments of the present disclosure in light of the above detailed description.

The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

The invention claimed is:

1. A system to manufacture an electronic circuit assembly, comprising:
   a flexible substrate to receive at least one electronic device of the electronic circuit assembly, wherein the flexible substrate comprises a substrate registration feature;
   a primary carrier, with a primary carrier registration feature that comprises a post, to receive the flexible substrate; and
   a secondary carrier that includes a split rivet to be received by the primary carrier registration feature to removably fix the flexible substrate to the primary carrier, wherein the flexible substrate is to receive the at least one electronic device of the electronic circuit assembly when the flexible substrate is affixed to the primary carrier,
   wherein the post of the primary carrier is to be received by a vertical length of the split rivet of the secondary carrier to expand a head of the split rivet substantially horizontally against the substrate registration feature of the flexible substrate.

2. The system of claim 1, wherein the flexible substrate comprises a polyimide film, a polyether ether ketone film, or a polyester film.

3. The system of claim 2, wherein the primary carrier comprises metal or plastic.

4. The system of claim 2, wherein the split rivet is to be received by the substrate registration feature to removably fix the flexible substrate to the primary carrier.

5. The system of claim 2,
   wherein the split rivet is built into the secondary carrier; and
   wherein the post is built into the primary carrier.

* * * * *